United States Patent [19]

Levit

[11] Patent Number: 5,348,033
[45] Date of Patent: Sep. 20, 1994

[54] METHOD AND APPARATUS FOR HANDLING SINGULATED ELECTRONIC COMPONENTS

[75] Inventor: Boris Levit, Cupertino, Calif.

[73] Assignee: National Semiconductor Corporation, Santa Clara, Calif.

[21] Appl. No.: 770,973

[22] Filed: Oct. 1, 1991

[51] Int. Cl.$^5$ ................................. B08B 3/02
[52] U.S. Cl. ......................... 134/64 R; 134/122 R; 134/199; 134/902; 198/817
[58] Field of Search ................. 134/64 R, 122 R, 902, 134/72, 131; 198/502.3, 817, 495, 495, 818, 820, 681, 690.1

[56] References Cited

U.S. PATENT DOCUMENTS

| | | | |
|---|---|---|---|
| 1,090,845 | 3/1914 | Goss et al. | 134/131 |
| 2,166,428 | 7/1939 | Du Bois | 41/9 |
| 2,250,238 | 7/1941 | Smith | 134/72 |
| 2,855,094 | 10/1958 | Zebarth | 198/495 |
| 3,129,713 | 4/1964 | Read | 134/73 |
| 3,138,239 | 6/1964 | Ackerman et al. | 198/817 |
| 3,193,085 | 7/1965 | Whipple et al. | 198/817 |
| 3,282,273 | 11/1966 | Johnston | 134/102 |
| 3,411,511 | 11/1968 | Fisher | 134/72 |
| 3,871,914 | 3/1975 | Goffredo et al. | 134/199 |
| 3,965,523 | 6/1976 | Elliott | 134/199 X |
| 3,978,979 | 9/1976 | Mezey | 198/817 |
| 4,135,346 | 1/1979 | Rebsamen | 198/502.3 |
| 4,165,756 | 8/1979 | Sirch . | |
| 4,281,675 | 8/1981 | Pure . | |
| 4,296,769 | 10/1981 | van der Lugt | 134/199 X |
| 4,422,541 | 12/1983 | Lisec | 198/817 X |
| 4,457,419 | 7/1984 | Ogami et al. | 198/817 |
| 4,508,611 | 4/1985 | Johnson . | |
| 4,534,843 | 8/1985 | Johnson . | |
| 4,643,129 | 2/1987 | Sari | 198/817 |
| 4,705,159 | 11/1987 | Feliks et al. | 198/817 |
| 4,823,940 | 4/1989 | Crester | 198/817 |
| 4,889,070 | 12/1989 | Sari | 198/817 |
| 4,907,612 | 3/1990 | Levit . | |
| 4,960,200 | 10/1990 | Pierce | 198/495 |
| 5,009,306 | 4/1991 | Roderick et al. | 198/817 |
| 5,029,696 | 7/1991 | Van Tilburg | 198/226.1 |
| 5,048,549 | 9/1991 | Hethcoat | 134/902 |

OTHER PUBLICATIONS

Protest Under 37 C.F.R. 1.2981(a) (Sep. 17, 1993) (with Declaration by Jawn Swan dated Sep. 15, 1993).

*Primary Examiner*—Frankie L. Stinson
*Attorney, Agent, or Firm*—Limbach & Limbach

[57] ABSTRACT

A method and apparatus for translating parts along a path between processing stations. In a class of preferred embodiments, the parts are singulated electronic components, and the processing stations include nozzle arrays for directing jets of process fluid (such as water chemicals, gas or air) at the components. Each part rests on a pair of horizontally separated, endless belts. The top, bottom, and side surfaces of each part (and any leads protruding from the parts) are simultaneously exposed to treatment apparatus that may be positioned above and below the belts. If a downward-oriented nozzle array is disposed above the belts and an upward-oriented nozzle array is disposed below the belts, at the same position along the processing path, the top, bottom, and side surfaces of each part can be simultaneously exposed to process fluid jets from the nozzles. Preferably, a net downward fluid pressure is exerted on each part to maintain the part in its proper position at rest on the belts, while the part is exposed to the fluid jets.

18 Claims, 4 Drawing Sheets

METHOD AND APPARATUS FOR HANDLING SINGULATED ELECTRONIC COMPONENTS

FIELD OF THE INVENTION

The invention relates to material handling methods and apparatus for translating parts (such as singulated electronic components) along a path between processing stations.

BACKGROUND OF THE INVENTION

In a number of semiconductor assembly and post-assembly operations it is necessary to process singulated electronic components, such as MDIP, CDIP, and PLCC components. For example, it is often necessary to remove an existing mark on the surface of each component.

Abrasive mark removal processes are widely employed in the semiconductor industry. However, conventional processes of this type typically leave large amounts of residue (i.e., plastic or ceramic particles from the packages undergoing treatment, or particles of the abrasive medium) on the top and bottom surface of each package, on the leads of the packaged components. It is necessary to clean (wash and dry) the processed packages before new, high quality marks can be placed on them.

However, until the present invention, it had not been known how to design and operate a material handling system capable of transporting single packaged electronic components during such cleaning operations, without jamming or mechanical damage, and in a such a manner that both the top and bottom surfaces of the components are simultaneously exposed to the cleaning and drying media. In the prior art, packaged electronic components were typically cleaned (washed and dried) manually in batch loads (usually in baskets), which frequently resulted in damage to the components being cleaned.

SUMMARY OF THE INVENTION

The invention is a method and apparatus for translating parts along a path between processing stations. In a class of preferred embodiments, the parts are singulated electronic components, and the processing stations include nozzle arrays for directing jets of fluid (such as water, heated air, or other cleaning or drying fluids) at the components. Each part rests on (or in) a pair of parallel shelves (or grooves) defined by a pair of horizontally separated, endless belts. Thus, both top and bottom surfaces of each part are exposed to treatment apparatus that may be positioned above and below the belts.

If a downward-oriented nozzle array is disposed above the belts and an upward-oriented nozzle array is disposed below the belts (at the same position along the processing path), both top and bottom surfaces of each part can be simultaneously exposed to process fluid jets from the nozzles. Preferably, the downward flowing jets are maintained at a higher pressure than are the upward flowing jets, or each jet exerts the same pressure on the part but more downward flowing jets than upward flowing jets are directed at the part. In either case, a net downward pressure on each part maintains it in its proper position, at rest on the shelves (or in the grooves) defined by the belts.

DETAILED DESCRIPTION OF THE PREFERRED EMBODIMENTS

Figure 1:
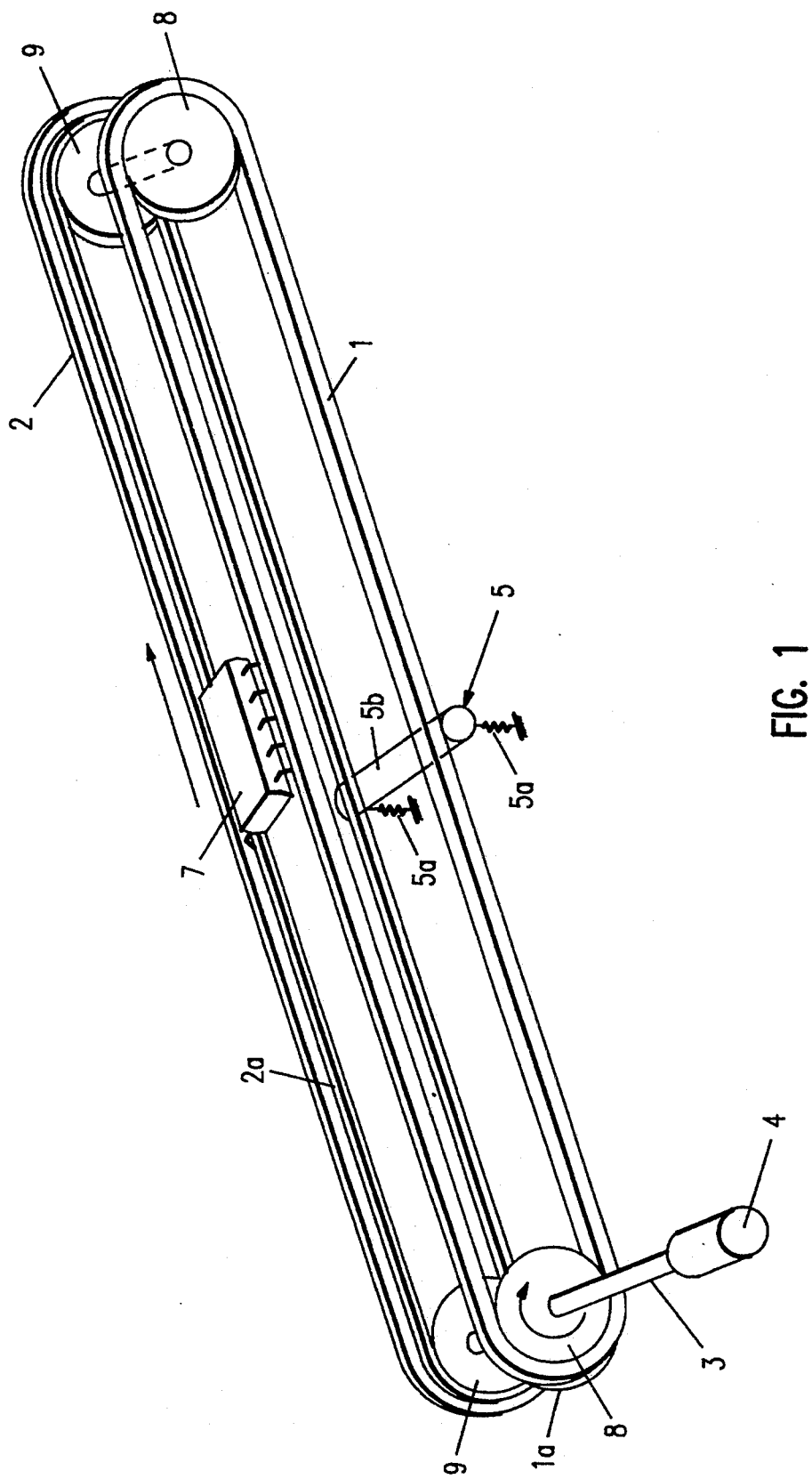
FIG. 1 is a simplified perspective view of a preferred embodiment of the inventive apparatus.

A first preferred embodiment of the inventive apparatus will be described with reference to FIG. 1. In FIG. 1, part 7 (a singulated electronic component) rests on a pair of parallel shelves 1a and 2a, defined respectively by horizontally separated, endless belts 1 and 2. Belt 1 is looped around pair of wheels 8. Belt 2 is looped around pair of wheels 9. Horizontally oriented shaft 3 is fixedly attached to one pair of adjacent wheels 8 and 9. As motor 4 rotates shaft 3 in a clockwise direction, belts 1 and 2 translate part 7 toward the right in FIG. 1.

The top surfaces of the package and leads of translating part 7 are thus exposed to any treatment apparatus that may be positioned above the space between belts 1 and 2, and the bottom surfaces of the package and leads of translating part 7 are exposed to any treatment apparatus that may be positioned below the space between belts 1 and 2.

Preferably, the FIG. 1 apparatus includes a belt tensioning mechanism 5 for preventing belts 1 and 2 from slackening (for example, due to stretching). Mechanism 5 includes springs 5a and member 5b. Springs 5a (which preferably exert an adjustable upward spring force) maintain a desired belt tension by urging member 5b upward against the lower ("return") portions of belts 1 and 2.

Figure 2:
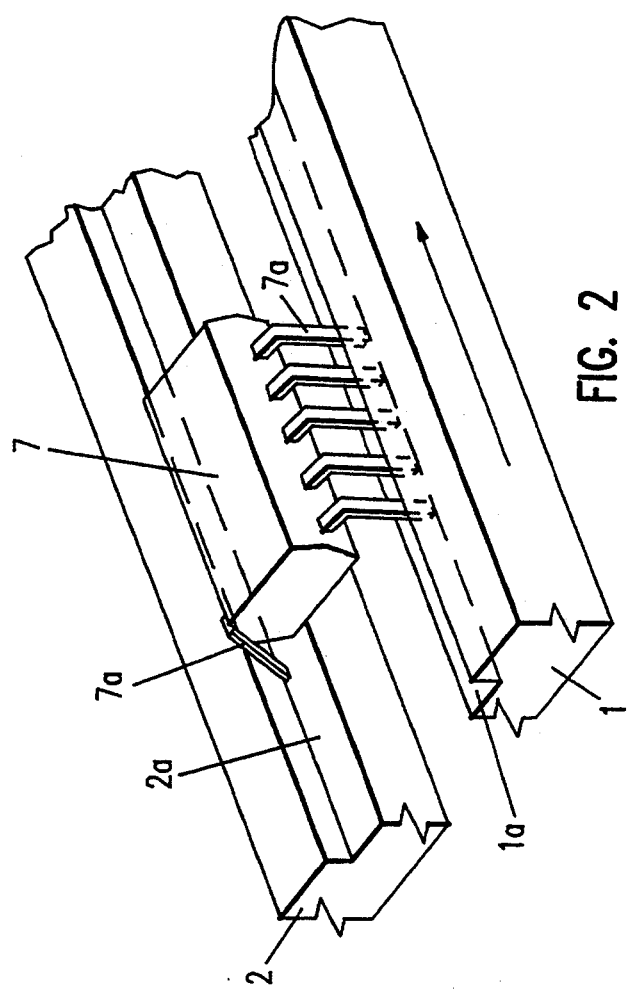
FIG. 2 is an enlarged view of a portion of the FIG. 1 apparatus.

Belts 1 and 2 are preferably molded from an elastic, ESD material such as static dissipative or conductive grade material. Also preferably, each belt is composed of material capable of withstanding high temperature, and is designed to protect the leads and package of each part from mechanical and electrical damage. In the embodiment of FIGS. 1 and 2, belt 1 is molded in a shape which defines an elongated horizontal shelf surface 1a, and belt 2 is molded in a shape which is the mirror image of the shape of belt 1, and which defines elongated horizontal shelf 2a. The geometry of shelves 1a and 2a is best shown in FIG. 2. Belts 1 and 2 are mounted (for example, by means to be described below with reference to FIG. 3) with an inter-belt spacing appropriate for supporting lead portions 7a of part 7 on shelves 1a and 2a (as shown in FIG. 2).

Figure 2C:
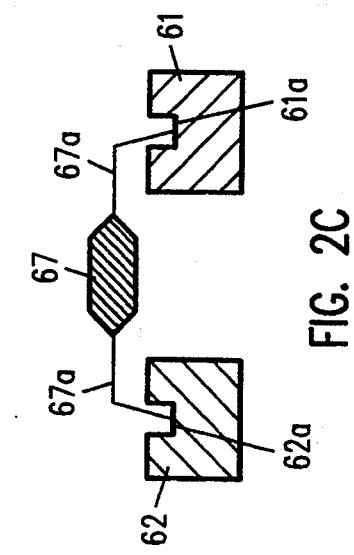
FIG. 2C is a cross-sectional view of yet another variation of the FIG. 2 apparatus.
Figure 2B:
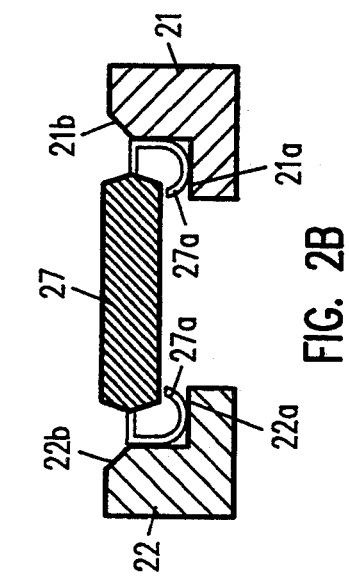
FIG. 2B is a cross-sectional view of another variation of the FIG. 2 apparatus.
Figure 2A:
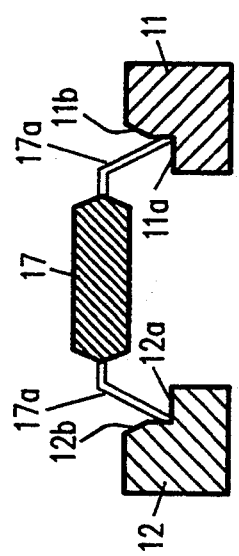
FIG. 2A is a cross-sectional view of a variation of the FIG. 2 apparatus.

The alternative embodiment shown in FIG. 2A includes belts 11 and 12 (which have a slightly different shape than do belts 1 and 2). Belts 11 and 12 have shelf portions 11a and 12a, respectively. Shelf portions 11a and 12a are spaced so that leads 17a of part 17 rest thereon as shown in FIG. 2A. Belts 11 and 12 have sloping surface portions 11b and 12b, respectively, which provide greater inter-belt clearance (permitting greater exposure of leads 17a to downward flowing fluid jets, and more convenient placement of part 17 in its proper position straddling shelves 11a and 12a).

In the alternative embodiment shown in FIG. 2B, belts 21 and 22 replace belts 1 and 2 of FIG. 2. Belts 21 and 22 have shelf portions 21a and 22a, respectively, which are spaced and dimensioned for receiving bent leads 27a of part 27. Belts 21 and 22 have sloping surface portions 21b and 22b, respectively, which serve the same purpose as portions 11b and 12b in the FIG. 2A embodiment.

In the alternative embodiment shown in FIG. 2C, belts 61 and 62 replace belts 1 and 2 of FIG. 2. Belts 61 and 62 define grooves 61a and 62a, respectively. Grooves 61a and 62a are dimensioned, and belts 61 and 62 are spaced, so that leads 67a of part 67 rest in grooves 61a and 62a as shown in FIG. 2C.

Figure 3:
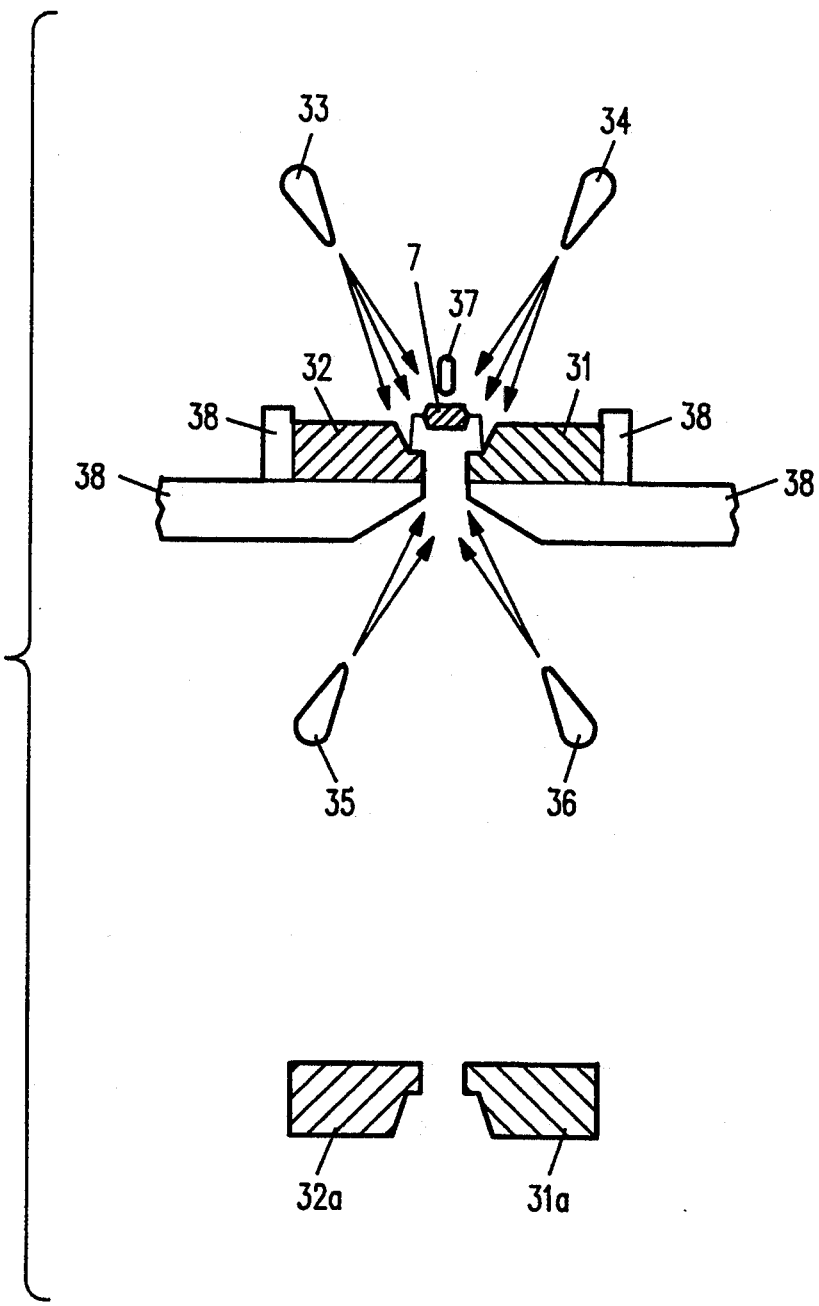
FIG. 3 is a cross-sectional view of a second preferred embodiment of the inventive apparatus.

In the FIG. 3 embodiment, part 7 straddles (and rests upon) the upper portions of endless belts 31 and 32. The upper portions of belts 31 and 32 carry part 7 (and optionally also other similarly shaped parts) into the plane of FIG. 3, while translate along an upper portion of a looped path. At the end of the upper path portion, each processed part is discharged from the belts, and the empty belts return (in the direction out of the plane of FIG. 3) along a lower (or "return") portion of the looped path (the path portion occupied by return portions 31a and 32a of belts 31 and 32, respectively).

The upper portions of belts 31 and 32 are supported and guided by fixedly mounted support members 38, as the translating belts 31 and 32 slide relative to the support members 38. Guide strip 37 is fixedly mounted above support members 38, to constrain upward motion of part 7 which rests on belts 31 and 32.

An array of downward pointing nozzles (including nozzles 33 and 34) is fixedly mounted above belts 31 and 32 along the upper path portion of belts 31 and 32. An array of upward pointing nozzles (including nozzles 35 and 36) is fixedly mounted below belts 31 and 32 along the upper path portion of belts 31 and 32. The nozzles comprising the downward and upward pointing arrays (i.e., all of nozzles 33–36) simultaneously direct process fluid jets at the top and bottom surfaces of part 7, as the part translates past the nozzles. Examples of the process fluid include liquid water for cleaning the part, and heated, pressurized air for drying the part.

Preferably, the downward flowing jets (i.e., the jets from nozzles 33 and 34) are maintained at a higher pressure than are the upward flowing jets (i.e., the jets from nozzles 35 and 36). Alternatively, each jet exerts the same pressure on part 7, but more downward flowing jets are directed at the part than upward flowing jets. In either case, a net downward pressure on each part maintains the part in its proper position, vertically at rest on belts 31 and 32.

Arrays of downward and upward pointing nozzles can be fixedly mounted at any number of processing stations along the upper path portion of belts 31 and 32, to perform sequential operations on the parts that are sequentially translated past such arrays by the belts.

Figure 4:
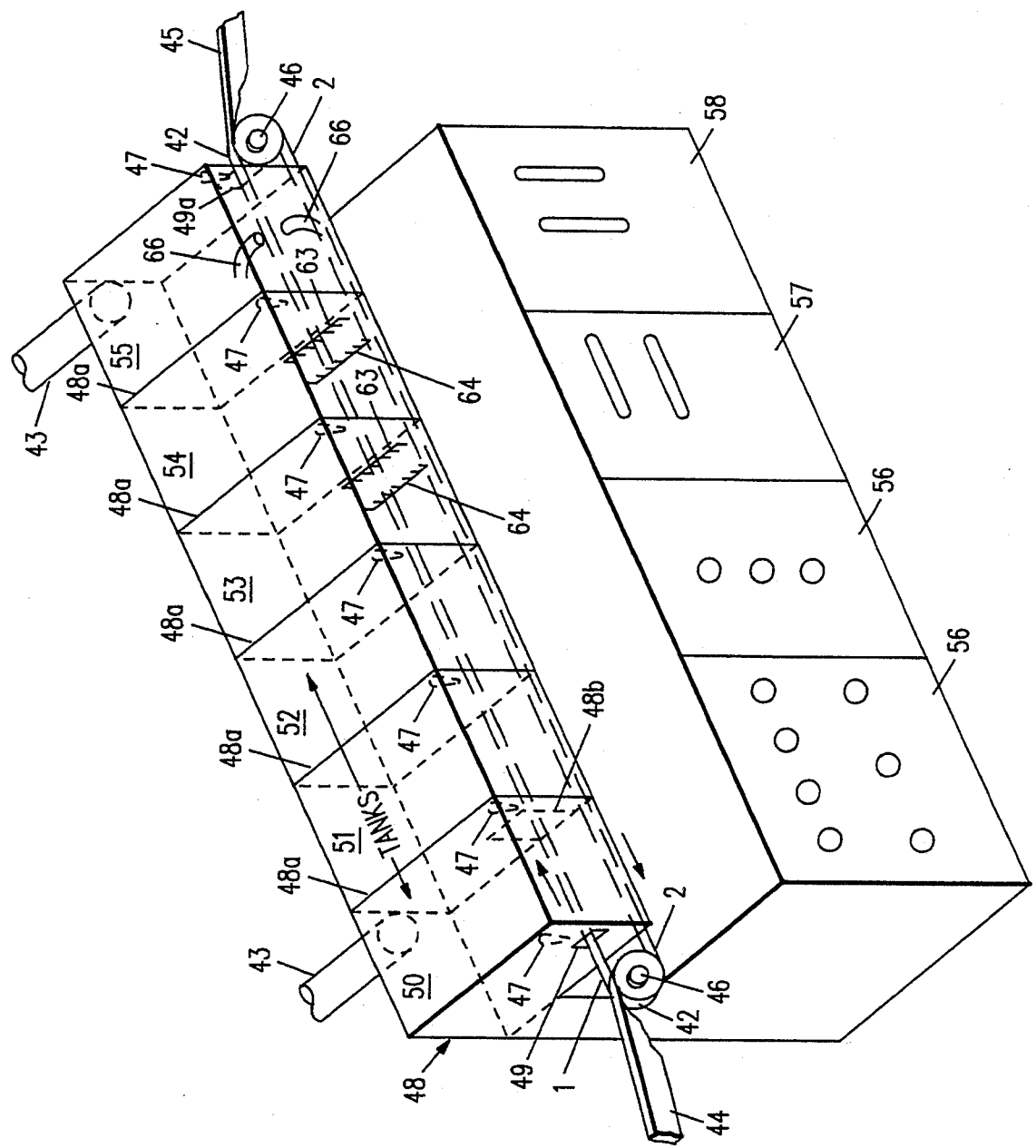
FIG. 4 is a simplified perspective view of a third preferred embodiment of the inventive apparatus.

In the embodiment of FIG. 4, belts 1 and 2 are dimensioned to carry electronic components (not shown) from an input mechanism 44, successively through process tanks 50, 51, 52, 53, 54, and 55, to an output mechanism 45. In one typical application, input mechanism 44 receives the components from an abrasive demarker apparatus (for abrasively removing marks from the components), and output mechanism 45 supplies the processed components to an automatic tube loader.

Belt 1 is looped around drive wheels 42. Belt 2 is looped around drive wheels 46. The separation between the input end wheels 42 and 46 (at the input end of the apparatus adjacent to mechanism 44), and between the output end wheels 42 and 46, can be adjusted to vary the inter-belt spacing. In this way, belts 1 and 2 can be adjusted to support components having any of a variety of widths.

Belts 1 and 2 translate components (the components which rest thereon) into tank housing 48 through opening 49. After undergoing processing within tanks 50–55 within housing 58, the processed components are discharged (through outlet opening 49a of housing 48) to output mechanism 45. The empty belts 1 and 2 then return back to the input end along an exposed return path beneath tanks 50–55. Because the belt return path is exposed in the FIG. 4 apparatus, belts 1 and 2 can be conveniently serviced and replaced.

Mounted within each of tanks 53 and 54 is a downward (or generally downward) pointing nozzle array 63 and an upward (or generally upward) pointing nozzle array 64, for simultaneously directing process fluid or air at the top and bottom faces of each component resting on belts 1 and 2 (and preferably also the side faces of each component), as the components translate one by one past each pair of nozzle arrays. Additional nozzle array pairs, preferably similar or identical to arrays 63 and 64, are mounted within each of tanks 50, 51, and 52, for the purpose of directing process fluid or air at the top and bottom sides of each component. Tank 55 preferably serves as a drying tank, in which nozzles 66 direct drying gas or air jets at the components translating past them.

Nozzles 63 and 64 can mounted within one or more of tanks 50–55 in positions for directing cleaning fluid jets directly onto belts 1 and 2, for removing residue from the belts, and thus preventing the transfer of residue on the belts between tanks.

Examples of process fluids that can be sprayed onto the components from the nozzles arrays of FIG. 4 include liquid water for cleaning purposes, and cold (or heated) gas (at high or low pressure) for drying or vacuuming purposes. For example, the following operations could be performed sequentially: vacuuming residue using low pressure air in tank 50, high pressure washing with water in tank 51, hot water washing in tank 52, cold air blow-off in tank 53, hot air drying in tank 54, and vacuuming residue using low pressure air in tank 55. Exhaust tubes (such as tubes 43 shown in FIG. 4) are provided for removing residue or vapor from tanks 50 and 55 (or any of the other tanks). Water heater 57 supplies hot water to nozzle arrays in tank 52. Air drying apparatus prepares air (i.e., by heating and drying it) which is supplied to nozzle arrays 63 and 64 of tank 54.

Partitions 48a of housing 48 separate the tanks 50–55 from each other, so that the outer portion of housing 48 and partitions 48a enclose (and thus define) tanks 50–55. Each of partitions 48a has an opening dimensioned to admit belts 1 and 2 (and the parts supported thereby). One such opening, identified by reference numeral 48b, is shown in FIG. 4 in the partition 48a between tanks 50 and 51.

Sensors 47 are mounted adjacent entrance and outlet openings 49 and 49a of housing 48, and adjacent an opening (i.e., opening 48b) in each partition 48a. Each sensor 47 monitors the segment of belts 1 and 2 adjacent thereto to detect the presence or absence of parts supported by the belts, and supplies to control processor 56 a sensor output signal indicative of the presence or absence of a part supported by the belts. Processor 56, which can be a conventional digital computer, is preferably programmed to indicate a "jam" condition if the sensor output signals indicate the absence of parts that were expected to be present at selected ones of the sensors 47 at preselected times. Upon detecting a jam, processor 56 preferably generate a control signal to the belt drive means (i.e., motor 4 shown in FIG. 1) for stopping belts 1 and 2. Optionally also, processor 56 generates control signals for shutting down operation of other system components, upon occurrence of a jam condition.

Processor 56 can also be programmed to generate control signals for controlling the temperature of water and drying air, the timing of processing operations, and the speed of the belts. Processor 56 can also be programmed to send and receive signals to and from external devices. For example, processor 56 can be programmed to generate control signals for shutting down operation of the entire system in response to reception of a jam signal from an external device, wherein the jam signal is indicative of a jam in a remote apparatus (e.g., an apparatus for handling parts conveyed through output mechanism 45).

Various modifications and alterations in the described embodiments of the invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus for translating parts between processing stations, including:
   a pair of horizontally separated, substantially parallel, endless belts dimensioned and profiled for supporting the parts;
   a drive means for translating the belts around a loop, thereby translating the parts supported by the belts along a path between the processing stations with top and bottom surfaces of each part supported by the belts exposed to regions above and below the belts, wherein each of the belts has a continuous, constant cross-section around the loop, and wherein the cross-section includes an inner shelf surface oriented substantially horizontally, an outer top surface oriented substantially horizontally, and a third surface between the inner shelf surface and the outer top surface, said third surface having a sloping portion, and;
   at least one of the parts supported by the belts, wherein said at least one of the parts is a singulated electronic component having a first row of leads and a second row of leads, and wherein the first row rests on the shelf portion of a first one of the belts and the second row rests on the shelf portion of a second one of the belts.

2. The apparatus of claim 1, wherein the belts are separated by a first distance, and also including:
   belt position adjustment means for varying the first distance between the belts, to achieve a desired inter-belt spacing for supporting parts having a desired width.

3. The apparatus of claim 1, wherein at least one of the processing stations includes a first nozzle array for directing generally upward-flowing process fluid jets at a bottom surface of each of the parts supported by the belts, and a second nozzle array for directing generally downward-flowing process fluid jets at a top surface of each of the parts supported by the belts.

4. The apparatus of claim 3, wherein the second nozzle array is disposed above the belts and the first nozzle array is disposed below the belts, and wherein top, bottom, and side surfaces of each part supported by the belts are simultaneously exposed to the generally upward-flowing process fluid jets and the generally downward-flowing process fluid jets.

5. The apparatus of claim 4, wherein the generally upward-flowing process fluid jets and the generally downward-flowing process fluid jets exert a net downward fluid pressure on each part supported by the belts.

6. The apparatus of claim 1, wherein at least one of the processing stations includes nozzles for directing process fluid jets at the belts, for removing residue from the belts.

7. The apparatus of claim 1, also including:
   a guide strip fixedly mounted along the path, for constraining upward movement of the parts supported by the belts while the belts translate along the path.

8. An apparatus for translating parts between processing stations, including:
   a pair of horizontally separated, substantially parallel, endless belts dimensioned and profiled for supporting the parts;
   at least one of the parts, supported by the belts; and
   a drive means for translating the belts around a loop, thereby translating the parts supported by the belts along a path between the processing stations with top and bottom surfaces of each part supported by the belts exposed to regions above and below the belts, wherein each of the belts has a continuous, constant cross-section around the loop, a first one of the belts has a top face with a first recessed portion, a second one of the belts has a top face with a second recessed portion, and said at least one of the parts has a first portion which rests on the first recessed portion and a second portion which rests on the second recessed portion.

9. The apparatus of claim 8, wherein each of the parts supported by the belts is a singulated electronic component having a first row of leads resting on the first recessed portion and a second row of leads resting on the second recessed portion.

10. An apparatus for processing parts in processing tanks arranged along a path, including:
    a housing having partitions which separate the processing tanks;
    a pair of horizontally separated, substantially parallel, endless belts dimensioned and profiled for supporting the parts;
    a drive means for translating the belts around a loop, thereby translating the parts supported by the belts along the path sequentially through the processing tanks with top, bottom, and side surfaces of each part supported by the belts exposed to regions of the processing tanks located above and below the belts, wherein each of the belts has a continuous, constant cross-section around the loop, and wherein the cross-section includes an inner shelf surface oriented substantially horizontally, an outer top surface oriented substantially horizontally, and a third surface between the inner shelf surface and the outer top surface, said third surface having a sloping portion, and;

at least one of the parts supported by the belts, wherein said at least one of the parts is a singulated electronic component having a first row of leads and a second row of leads, and wherein the first row rests on the shelf portion of a first one of the belts and the second row rests on the shelf portion of a second one of the belts.

11. The apparatus of claim 10, wherein the belts are separated by a first distance, and also including:

belt position adjustment means for varying the first distance between the belts, to achieve a desired inter-belt spacing for supporting parts having a desired width.

12. The apparatus of claim 10, wherein a first nozzle array is mounted within a first one of the processing tanks in a position for directing generally upward-flowing process fluid jets at a bottom surface of each of the parts supported by the belts, and a second nozzle array is mounted within said first one of the processing tanks in a position for directing generally downward-flowing process fluid jets at a top surface of each of the parts supported by the belts.

13. The apparatus of claim 12, wherein the second nozzle array is disposed above the belts and the first nozzle array is disposed below the belts, and wherein top, bottom, and side surfaces of each part supported by the belts are simultaneously exposed to the generally upward-flowing process fluid jets and the generally downward-flowing process fluid jets.

14. The apparatus of claim 13, wherein the generally upward-flowing process fluid jets and the generally downward-flowing process fluid jets exert a net downward fluid pressure on each part supported by the belts.

15. The apparatus of claim 10, also including:

a sensor mounted within at least one of the processing tanks, for detecting parts supported on the belts and generating an output signal indicative of the presence or absence of said parts on the belts; and a signal processor coupled to the sensor for receiving and processing said output signal.

16. The apparatus of claim 15, wherein the signal processor includes means for generating a control signal indicative of a jam condition, in the event that the output signal indicates the absence of a part at the sensor at a preselected time.

17. An apparatus for processing parts in processing tanks arranged along a path, including:

a housing having partitions which separate the processing tanks;

a pair of horizontally separated, substantially parallel, endless belts dimensioned and profiled for supporting the parts;

at least one of the parts, supported by the belts; and a drive means for translating the belts around a loop, thereby translating the parts supported by the belts along the path sequentially through the processing tanks with top, bottom, and side surfaces of each part supported by the belts exposed to regions of the processing tanks located above and below the belts, wherein each of the belts has a continuous, constant cross-section around the loop, a first one of the belts has a top face with a first recessed portion, a second one of the belts has a top face with a second recessed portion, and said at least one of the parts has a first portion which rests on the first recessed portion and a second portion which rests on the second recessed portion.

18. The apparatus of claim 17, wherein each of the parts supported by the belts is a singulated electronic component having a first row of leads resting on the first recessed portion and a second row of leads resting on the second recessed portion.

* * * * *